United States Patent
Vo et al.

(10) Patent No.: US 7,454,431 B2
(45) Date of Patent: Nov. 18, 2008

(54) METHOD AND APPARATUS FOR WINDOW MATCHING IN DELTA COMPRESSORS

(75) Inventors: Binh Dao Vo, Berkeley, NJ (US); Kiem-Phong Vo, Berkeley, NJ (US)

(73) Assignee: AT&T Corp., New York, NY (US)

( * ) Notice: Subject to any disclaimer, the term of this patent is extended or adjusted under 35 U.S.C. 154(b) by 831 days.

(21) Appl. No.: 10/894,424

(22) Filed: Jul. 19, 2004

(65) Prior Publication Data

US 2005/0044294 A1    Feb. 24, 2005

Related U.S. Application Data

(60) Provisional application No. 60/487,992, filed on Jul. 17, 2003.

(51) Int. Cl.
G06F 7/00 (2006.01)
H03M 7/30 (2006.01)
H03M 3/00 (2006.01)

(52) U.S. Cl. .................. 707/101; 341/76; 341/143; 707/5; 707/6

(58) Field of Classification Search ................ None
See application file for complete search history.

(56) References Cited

U.S. PATENT DOCUMENTS

| | | | |
|---|---|---|---|
| 4,823,201 A | 4/1989 | Simon et al. | |
| 5,285,276 A | 2/1994 | Citta | |
| 5,806,068 A | 9/1998 | Shaw et al. | |
| 5,838,834 A | 11/1998 | Saito | |
| 5,946,692 A | 8/1999 | Faloutsos et al. | |
| 6,031,671 A | 2/2000 | Ayres | |
| 6,263,444 B1 | 7/2001 | Fujita | |
| 6,351,229 B1 * | 2/2002 | Wang | 341/143 |
| 6,487,535 B1 * | 11/2002 | Smyth et al. | 704/500 |
| 6,653,954 B2 * | 11/2003 | Rijavec | 341/63 |
| 6,667,700 B1 * | 12/2003 | McCanne et al. | 341/51 |
| 6,959,300 B1 * | 10/2005 | Caldwell et al. | 707/101 |
| 7,017,043 B1 | 3/2006 | Potkonjak | |
| 7,031,972 B2 * | 4/2006 | Ren et al. | 707/101 |
| 7,043,077 B2 * | 5/2006 | Rijavec | 382/164 |
| 7,072,889 B2 * | 7/2006 | Ogawa | 707/104.1 |
| 7,096,311 B2 * | 8/2006 | Chiang | 717/171 |
| 2001/0004739 A1 * | 6/2001 | Sekiguchi et al. | 707/100 |
| 2002/0010702 A1 * | 1/2002 | Ajtai et al. | 707/101 |
| 2002/0169784 A1 * | 11/2002 | Cha et al. | 707/102 |
| 2003/0009596 A1 * | 1/2003 | Tonomura | 707/101 |
| 2003/0055833 A1 * | 3/2003 | Chan et al. | 707/100 |

(Continued)

OTHER PUBLICATIONS

Ajtai, et al., "Compacting Encoding Unstructured Inputs with Differential Compression", May 2002, Journal of the ACM, vol. 49, No. 3, p. 318-327, 330-331, 337, 362-363.*

(Continued)

*Primary Examiner*—Hosain T Alam
*Assistant Examiner*—Joseph D Wong

(57) ABSTRACT

The present invention significantly improves the performance of matching target file window partitions to source file window partitions in delta compression. In particular, the present invention enhances delta compression performance of delta compressors based on the idea of modeling a dataset with the frequencies of its n-grams and employs a method to compute good source and target window matching in linear time.

9 Claims, 8 Drawing Sheets

U.S. PATENT DOCUMENTS

| | | | |
|---|---|---|---|
| 2003/0115041 A1* | 6/2003 | Chen et al. ............... | 704/200.1 |
| 2003/0138045 A1 | 7/2003 | Murdock et al. | |
| 2003/0140337 A1 | 7/2003 | Aubury | |
| 2003/0174897 A1 | 9/2003 | Le Leannec et al. | |
| 2004/0039839 A1* | 2/2004 | Kalyanaraman et al. .... | 709/238 |
| 2004/0062130 A1* | 4/2004 | Chiang .................. | 365/230.03 |
| 2004/0190635 A1 | 9/2004 | Ruehle | |
| 2004/0221192 A1 | 11/2004 | Motta et al. | |
| 2005/0198056 A1* | 9/2005 | Dumais et al. .............. | 707/101 |
| 2005/0210056 A1* | 9/2005 | Pomerantz et al. .......... | 707/101 |

OTHER PUBLICATIONS

Klein, "Efficient Recompression Techniques for Dynamic Full-Text Retrieval Systems", Jul. 13, 1995, Proceedings of SIGIR'95, ACM Press, p. 39-47.*

Muthitacharoen et al., "A Low-bandwidth Network File System", ACM Symposium on Operating Systems SIGOPS, Oct. 2001, ACM Press, p. 174-187.*

Fukumoto et al., "An Automatic Extraction of Key Paragraphs Based on Context Dependency", Mar. 1997, Proceedings of the Fifth Conference on Applied Natural Language Processing, Morgan Kaufmann Publishers, p. 291-298.*

Kukich, "Techniques for Automatically Correcting Words in Text", Dec. 1992, ACM Computing Surveys, vol. 24, No. 4, p. 377-439.*

Shapira et al, "In-Place Differential File Compression of Non-Aligned Files With Applications to File Distribution, Backups, and String Similarity", Mar. 23, 2004, Data Compression Conference 2004, IEEE Press, p. 1-10.* van Hoff et al, "Generic Diff Format Specification", Aug. 25, 1997, W3C.org, p. 1-4. <http://www.w3.org/TR/NOTE-gdiff-19970825.html>.*

Korn et al, "Engineering a Differencing and Compression Data Format", Nov. 3, 2002, USENIX Conference, ACM, p. 1-10.*

Vo et al, "Using Column Dependency to Compress Tables", Mar. 23, 2040, Data Compression Conference 2004, IEEE Press, p. 1-10.*

Liefke et al, "XMill: an Efficient Compressor for XML Data", May 14, 2000, Proc. of SIGMOD, ACM, p. 1-12.*

Burrows et al, "A Block-sorting Lossless Data Compression Algorithm", May 10, 1994, Digital Systems Research Center, p. 1-18.*

Buchsbaum et al, "Improving Table Compression with Combinatorial Optimization", Jan. 2002, Proc 13th ACM-SIAM Symposium on Discrete Algorithms, p. 1-10.*

Hunt et al, "Delta Algorithms: An Empirical Analysis", 1998, ACM Transactions on Software Engineering and Methodology, vol. 7, p. 192-214.*

Buchsbaum et al, "Engineering the Compression of Massive Tables: An Experimental Approach", Jan. 9, 2000, Proc. 11th ACM-SIAM Symp. of Discrete Algorithms, p. 1-10.*

Korn et al, "The VCDIFF Generic Differencing and Compression Data Format", Jun. 2002, RFC 3284, Standards Track, p. 1-29.*

Xu et al, "A Brief Survey of Program Sliciing", Mar. 2004, ACM SIGSOFT Software Engineering Notes, vol. 30, No. 2, p. 1-36.*

Mogul et al, "Potential benefits of delta encoding and data compression for HTTP (Corrected Version)", Dec. 1997, WRL Research Report 97/4a, Digital Western Research Laboratory,p. 1-50.*

Huffman, "A Method for the Construction of Minimum-Redundancy Codes", Sep. 1952, Proceedings of the IRE, vol. 40, No. 9, p. 1098-1101.*

Fiala, et al., "Data Compression with Finite Windows", Communications of ACM, vol. 32, issue 4, Apr. 1998, pp. 490-505.

* cited by examiner

500

```
1    d = m = 0;
2    for(i=0; i<A; i+=1)
3    {   d += abs(F_W[i] - F_T[i]);
4        m += max(F_W[i], F_T[i]);
5    }
6
7    btstd = d/m; besti = 0;
8    for(i=1; i<s-t+1; i+=1)
9    {   d -= abs(F_W[S_{i-1}] - F_T[S_{i-1}]);
10       m -= max(F_W[S_{i-1}], F_T[S_{i-1}]);
11       F_W[S_{i-1}] -= 1;
12       F_W[S_{i+t-n}]) += 1;
13       d += abs(F_W[S_{i+t-n}] - F_T[S_{i+t-n}]);
14       m += max(F_W[S_{i+t-n}], F_T[S_{i+t-n}]);
15       if(d/m < betsd)
16           { bestd = d/m; besti = i; }
17   }
```

FIG. 5

METHOD AND APPARATUS FOR WINDOW MATCHING IN DELTA COMPRESSORS

This application claims the benefit of U.S. Provisional Application No. 60/487,992 filed on Jul. 17, 2003, which is herein incorporated by reference.

The present invention relates generally to data compression and, more particularly, to a method for efficient window partition matching in delta compressors to enhance compression performance based on the idea of modeling a dataset with the frequencies of its n-grams.

BACKGROUND OF THE INVENTION

Compression programs routinely limit the data to be compressed together in segments called windows. The process of doing this is called windowing. Delta compression techniques were developed to compress a target file given some other related source file. An early example delta compressor was the UNIX diff tool which computes differences between versions of text files by matching text lines across files. Diff was used to reduce disk storage in UNIX based source code control systems such as Source Code Control System (SCCS) and Revision Control System (RCS). One of the first delta compressors that could deal with binary data was Vdelta. Unlike other delta compressors which do nothing without source data, the algorithm used in Vdelta compresses data when source data is absent. Vdelta was used in the Bell Labs source and binary code control system (SBCS) and later in the experiments that spurred the addition of delta-encoding to the Internet HTTP protocol. Windowing is necessary to delta compressors partly due to their use of memory-intensive string matching algorithms and partly due to improved coding of addresses of matches. Here, windowing means first dividing a target file into data segments called target windows, then for each target window selecting some suitably similar source window to compress against. Current practice uses source data with matching file offsets to given target windows. This may work for file versions created by simple editing but often fails when significant data updates happen between versions.

Therefore, a need exists for a method for efficiently matching target file windows with source file windows to improve delta compression performance.

SUMMARY OF THE INVENTION

In one embodiment, the present invention significantly improves the performance of matching target file window partitions to source file window partitions in delta compression. In particular, the present invention enhances delta compression performance of delta compressors based on the idea of modeling a dataset with the frequencies of its n-grams and employs a method to compute good source and target window matching in time O(s).

BRIEF DESCRIPTION OF THE DRAWINGS

The teaching of the present invention can be readily understood by considering the following detailed description in conjunction with the accompanying drawings, in which:

FIG. 5 illustrates a detailed window matching algorithm in C programming codes of the present invention;

To facilitate understanding, identical reference numerals have been used, where possible, to designate identical elements that are common to the figures.

DETAILED DESCRIPTION

The present invention relates to data compression using delta compressors based on the idea of modeling a dataset with the frequencies of its n-grams.

To better understand the present invention, a description of n-grams and its use are first provided. The present invention uses n-grams to model data. For any data segment S with length s, an n-gram in S is a subsequence of n<s consecutive bytes. Assume an arbitrary but fixed n, the notation $S_i$ will denote the n-gram in S starting at location i while S[i] denotes the byte at location i. For example, the string S=abababac is of length 8 and has five 4-grams, of which three are distinct: abab, baba and abac. The 4-grams $S_0$ and $S_2$ are the same: abab.

The present invention repeatedly examine n-gram frequencies of given data segments. Thus, it is beneficial if this step can be executed quickly. For any general data segment S, the notation $F_S$ shall be used to denote an associative array of frequencies indexed by the n-grams of S. Suppose that $F_S$ was initialized to 0's, the below loop computes all n-gram frequencies:

for (i=0; i<=s-n; i+=1)
$F_S[S_i]$+=1;

This loop runs in time O(s) as long as the cost of indexing the array $F_S$ can be bounded by some constant. This can be ensured by implementing $F_S$ as a hash table indexed by the distinct n-grams. However, hash table look-up cost is significant and the frequency estimates do not always need to be exact. Thus, $F_S$ is chosen to be implemented as a normal array of size A by hashing each n-gram $S_i$ to an integer via the below hash function with some preselected constant α:

$$\chi(S_i) = (\alpha^{n-1} S[i] + \alpha^{n-2} S[i] + \ldots + S[i+n-1]) \bmod A \quad \text{(Equ. 1)}$$

The above loop then becomes:
for (i=0; i<=s-n; i+=1)
$F_S[\chi(S_i)]$+=1;

For nontrivial values of n, the loop can be further optimized by exploiting the linearity of the hash function χ to compute $\chi(S_{i+1})$ from $\chi(S_i)$ via:

$$\chi(S_{i+1}) = \{\alpha(\chi(S_i) - \alpha^{n-1} S[i]) + S[i+n]\} \bmod A \quad \text{(Equ. 2)}$$

For assessment and identification of string similarity in delta compressors, larger values of n are required (n usually greater than 1). In that case, a small number of n-grams may collide and get mapped into the same indices in $F_S$. Henceforth, given a data segment S and a frequency array $F_S$, it shall be assumed that $F_S$ is indexed by mapping the n-grams via the $\chi$ function as described. Therefore, the notation $F_S[S_i]$ will mean $F_S[\chi(S_i)]$.

Figure 1:
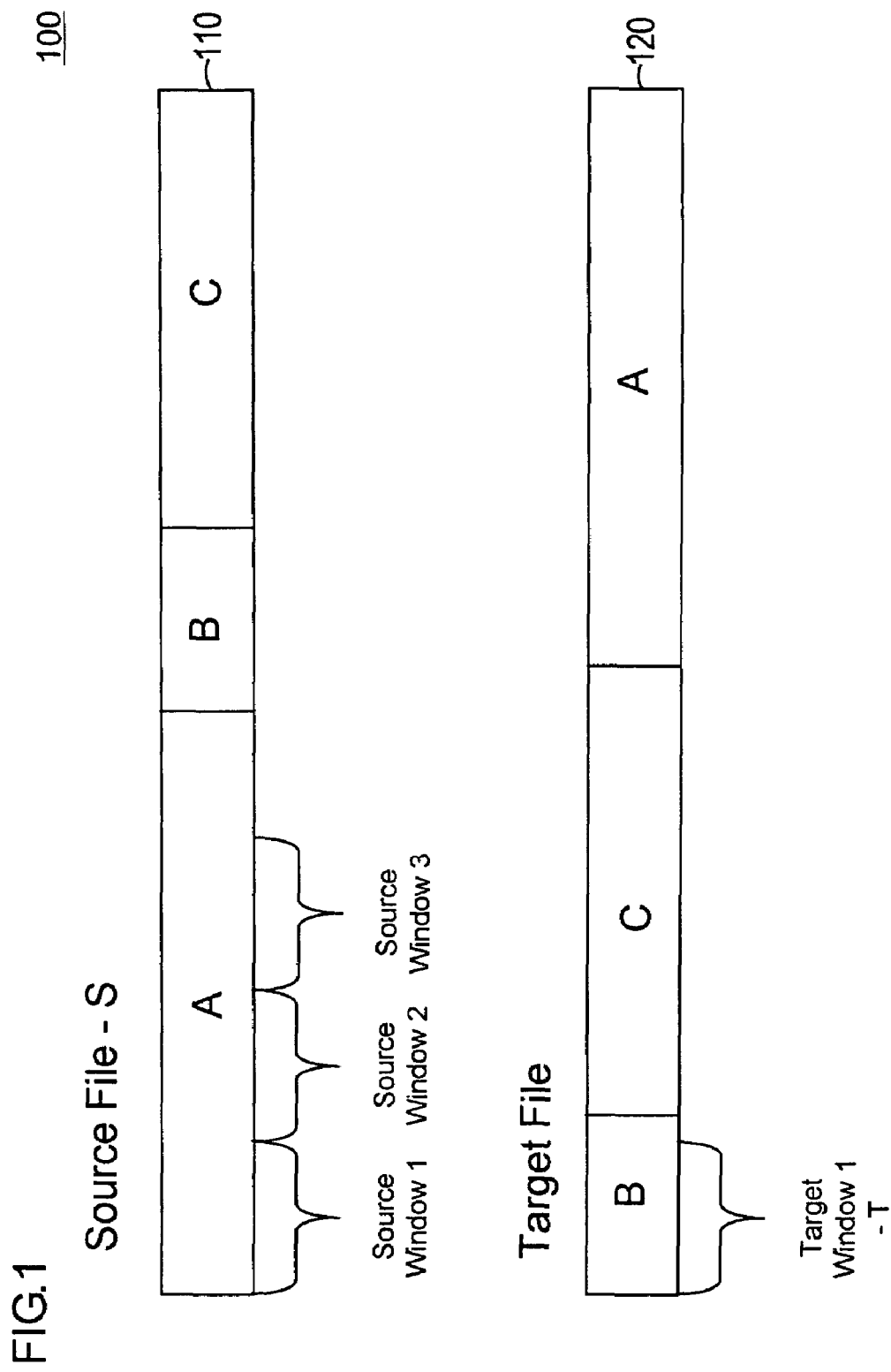
FIG. 1 illustrates an example of window matching using the file offset alignment strategy.

Delta compressors typically deal with two files at a time. A target file is compressed against some related source file. For large files, windowing is done by first dividing the target file into target windows, then compressing each such window against some source window. A source window is often from the source file but it could also come from some part of the target file earlier than the current target window. Since the target file is often a later version of the source file created via local editing operations, windowing is conventionally done by aligning a target window with a source window in the source file using the same file offset. However, it is increasingly common to have more extensive changes between versions, for example, in applications that compute patches between archives of source code or store versions of daily disk back-up archives. The file offset alignment strategy is often ineffective for processing these very large files because data may be moved to remote locations between versions. FIG. 1 illustrates an example of window matching using the file offset alignment strategy. The source file S contains three string based sections A, B, and C ordered consecutively in sequence. The target file is simply a version of the source file by moving section A to the end of the file via local editing. The target file contains the same string based sections as the source file but the sections are ordered in the sequence of B, C, and A instead. If target window 1, T, is used to match against source window 1, a match cannot be found. In fact, the contents in the T have shifted quite far away from the source window 1. In this case, the file offset alignment strategy performs very poorly in matching a target window with a source window. A brute force approach is to simply align a target window with every location in the source file and run the compression algorithm itself to find the best one. This would be unbearably slow.

To address this criticality, the present invention provides a method for matching source and target file windows by modeling data using n-grams. The present invention gives a way to construct fast linear-time window matching algorithms.

In the present invention, the concept of signatures to represent a data segment is introduced. Given a data segment P of length $\lambda$, define its signature $\sigma(P)$ as the sum of the hash values of all n-grams using the same hash function shown in Equ. 1 and 2. If i represents the hashed value of n-grams and A is the size of the n-gram frequency array, then:

$$\sigma(P) = \sum_{i=0}^{A-1} F_P[i] \quad \text{(Equ. 3)}$$

The constant A is chosen so that the total sum would not exceed the maximum allowed size in a computer word. In one embodiment of the present invention, $\lambda$ is typically $2^{10}$ so $A=2^{20}$ is used to ensure that each signature fits in a 32-bit integer. A nice property of $\sigma(\ )$ is that similar data segments get mapped to similar values. The signature distance between two segments $P_1$ and $P_2$ is defined as:

$$\delta(P_1, P_2) = \frac{|\sigma(P_1) - \sigma(P_2)|}{\max(\sigma(P_1), \sigma(P_2))} \quad \text{(Equ. 4)}$$

Figure 2:
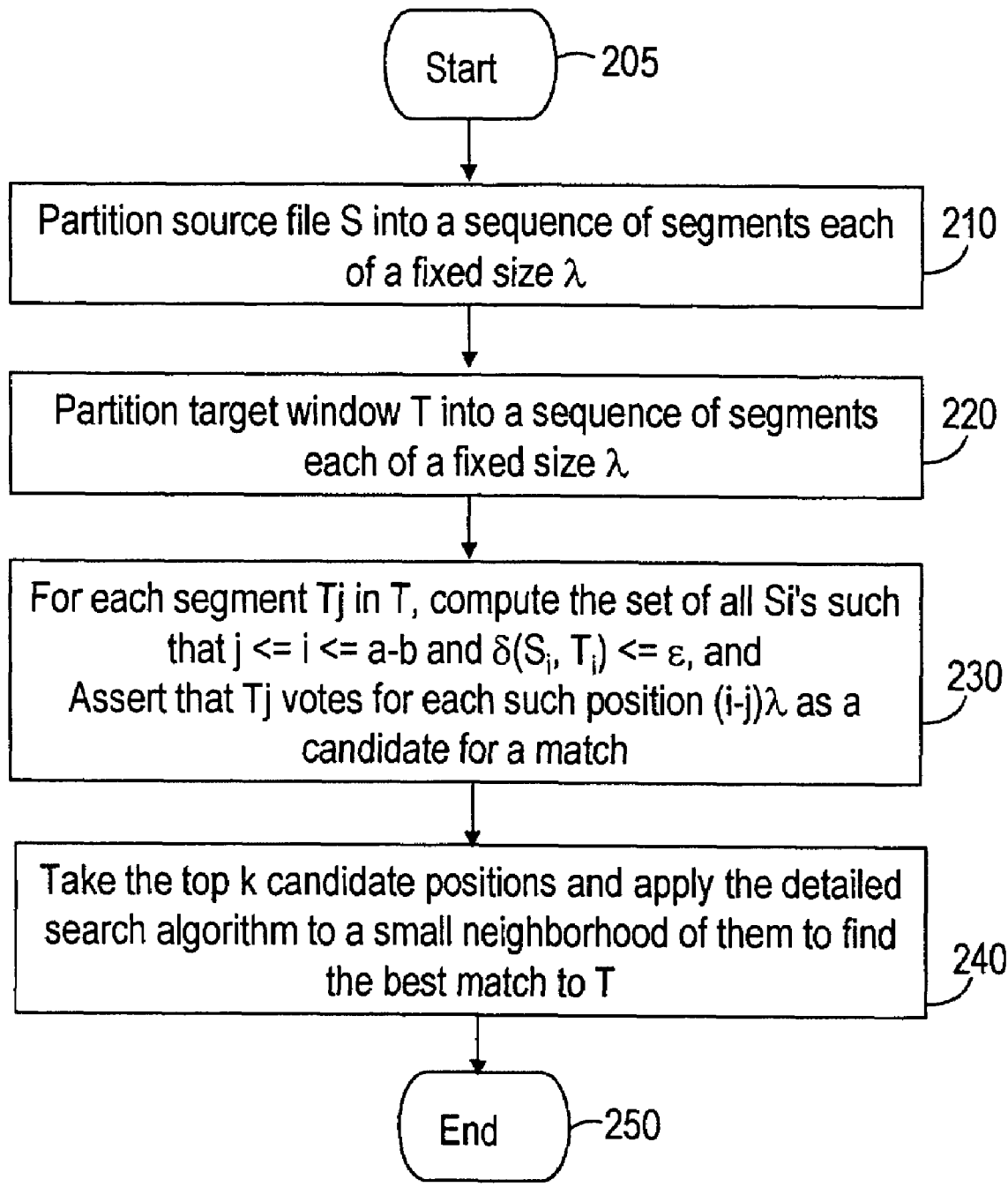
FIG. 2 illustrates a flowchart of a fast search for source window matching method of the present invention.

FIG. 2 illustrates a flowchart of a fast search for matching source window method 200 of the present invention. Method 200 starts in step 205 and proceeds to step 210.

Figure 3:
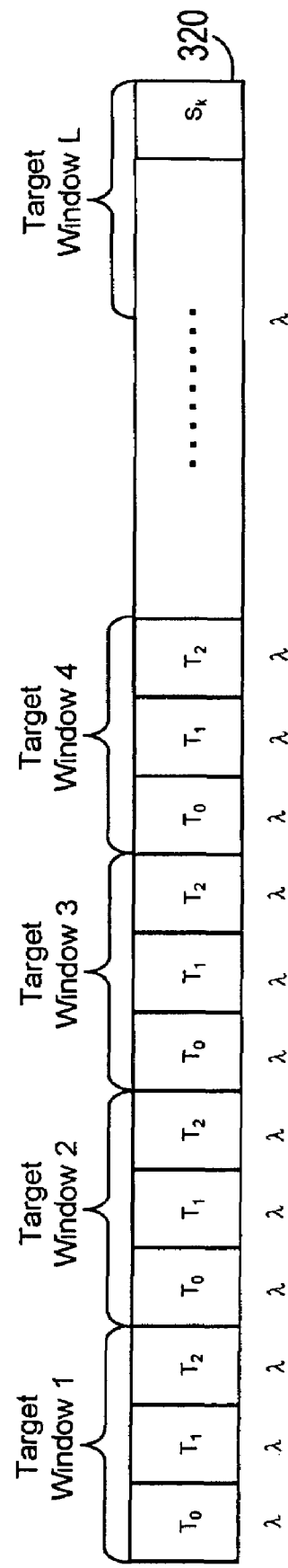
FIG. 3 illustrates an exemplary partition of the source and target files of the present invention.

In step 210, a source file S is partitioned into a sequence of segments, $S0, S_1, \ldots, S_a$, each of fixed size $\lambda$ in length as shown in 310 in FIG. 3. Note that the starting offset of segment $S_i$ in the source file is $i\lambda$. The last segment is omitted if it is smaller than $\lambda$.

In step 220, a target file is $k\lambda$ in length and is split into L target windows as shown in 320 in FIG. 3. Each target window T is further split into a sequence of segments $T_0, T_1, \ldots, T_b$ each of the same size $\lambda$ as shown in 320 in FIG. 3. Note that the target window size is arbitrary and can be chosen to suit a particular application or implementation. Therefore, the values of b and L are arbitrary as well, depending on the value of the target window size chosen. In one is chosen to be $3\lambda$ and the values of b and L are therefore 3 and $k\lambda/3$ respectively.

Figure 4:
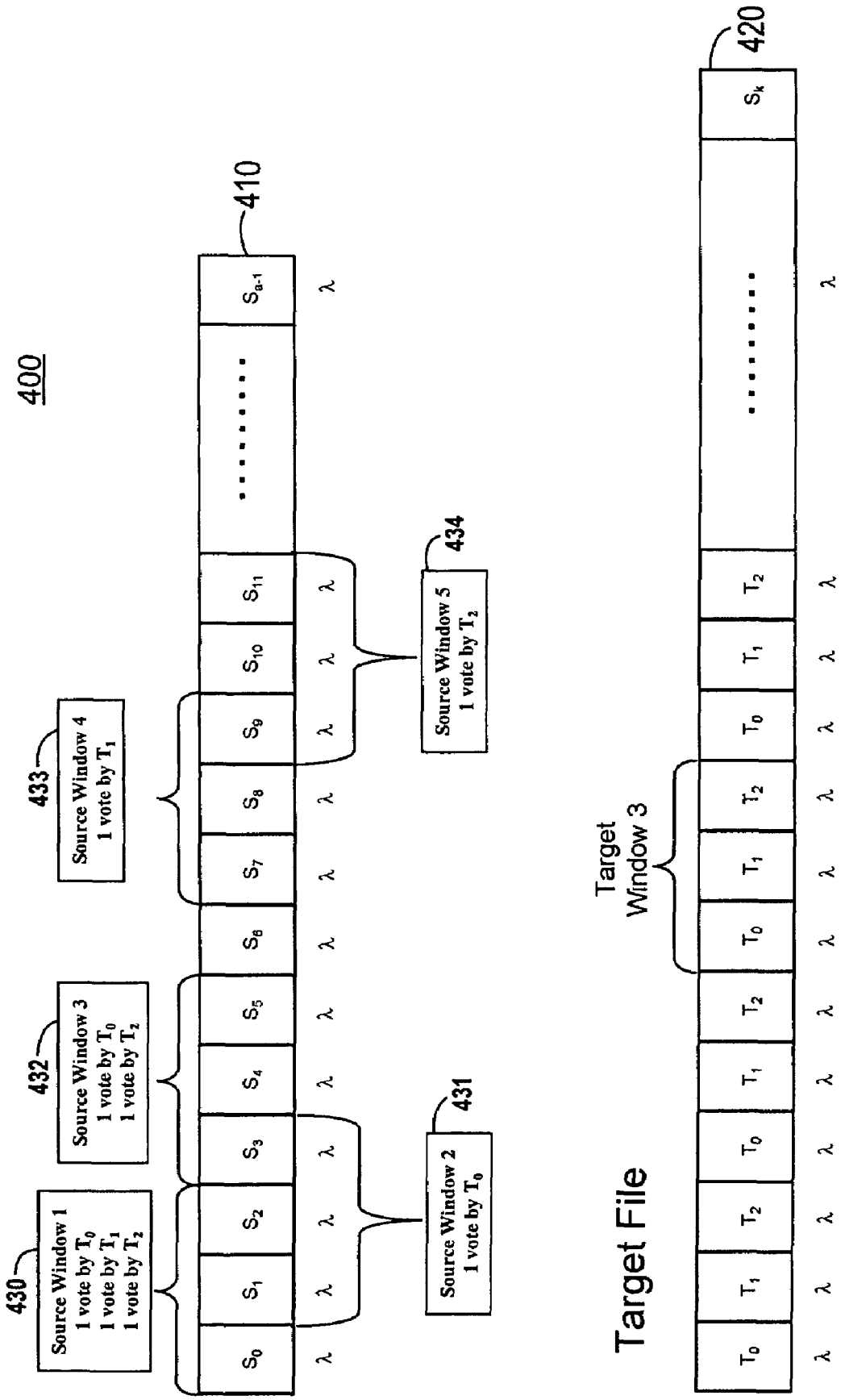
FIG. 4 illustrates the candidate source window matches with the target window T and the associated votes by target each target segment in target window T.

In step 230, for each segment $T_j$ in a particular target window T, the set of all $S_i$'s such that $j \leq i \leq a-b$ and $\delta(S_i, T_j) \leq \epsilon$ are computed. Then, the method asserts $T_j$'s vote for each such source window with starting offset $(i-j)\lambda$ as a candidate for a match. Note that different segments in T may vote for the same position. To further illustrate this step, the example in FIG. 4 is used. In FIG. 4, the current target window T is target window 3. For segment $T_0$ in T, $T_0$ will be used to compute the signatures in conjunction with source segments $S_0, S_1, S_2, \ldots, S_{a-b}$ to produce $\delta(S_0, T_0), \delta(S_1, T_0), \delta(S_2, T_0), \ldots$, and $\delta(S_{a-b}, T_0)$. Similarly, for segment $T_1$ in T, $T_1$ will be used to compute the signatures in conjunction with source segments $S_1, S_2, S_3, \ldots, S_{a-b}$ to produce $\delta(S_1, T_1), \delta(S_2, T_1), \delta(S_3, T_1)$, and $\delta(S_{a-b}, T_1)$. Similarly, for segment $T_2$ in T, $T_2$ will be used to compute the signatures in conjunction with source segments $S_2, S_2, S_4, \ldots, S_{a-b}$ to produce $\delta(S_2, T_2), \delta(S_3, T_2), \delta(S_4, T_2), \ldots$, and $\delta(S_{a-b}, T_2)$. Considering an example with signatures of all source and target segment pairs that meet the condition of $\delta(S_i, T_i) \leq \epsilon$ are shown in TABLE 1.

TABLE 1

| Source Target Segment Pairs Meeting Condition of $\delta(S_i, T_i) \leq \epsilon$ |
| --- |
| $S_0, T_0$ |
| $S_1, T_0$ |
| $S_3, T_0$ |
| $S_1, T_1$ |
| $S_8, T_1$ |
| $S_2, T_2$ |
| $S_5, T_2$ |
| $S_{11}, T_2$ |

In this example, the candidate source windows that potentially match the current target window T and their associated votes by each target segment are shown in 430 to 434 in FIG. 4. The eight source and target window pairs that meet the $\delta(S_i, T_i) \leq \epsilon$ condition in this example produces five candidate matching source windows for the current target window.

For target window segment $T_0$, it has a potential match with $S_0, S_1,$ and $S_3$. In this case, j=0 and i=0, 1, and 3. Applying the previously defined rule of voting, then the $T_0$ and $S_0$ segment pair leads to 1 vote by target window segment $T_0$ for candidate source window 1 which contains source segments $S_0, S_1,$ and $S_2$; the $T_0$ and $S_1$ segment pair leads to 1 vote by target window segment $T_0$ for candidate source window 2 which contains source segments $S_1, S_2,$ and $S_3$; the $T_0$ and $S_3$ segment pair leads to 1 vote by target window segment $T_0$ for candidate source window 3 which contains source segments $S_3, S_4,$ and $S_5$.

For target window segment $T_1$, it has a potential match with $S_1$ and $S_8$. In this case, j=1 and i=1 and 8. Applying the previously defined rule of voting, then the $T_1$ and $S_1$ segment pair leads to 1 vote by target window segment $T_1$ for candidate source window 1 which contains source segments $S_0$, $S_1$, and $S_2$; the $T_1$ and $S_8$ segment pair leads to 1 vote by target window segment $T_1$ for candidate source window 4 which contains source segments $S_7$, $S_8$, and $S_9$.

For target window segment T2, it has a potential match with S2, S5, and $S_{11}$. In this case, j=2 and i=2, 5, and 11. Applying the previously defined rule of voting, then the $T_2$ and $S_2$ segment pair leads to 1 vote by target window segment $T_2$ for candidate source window 1 which contains source segments $S_0$, $S_1$, and $S_2$; the $T_2$ and $S_5$ segment pair leads to 1 vote by target window segment $T_2$ for candidate source window 3 which contains source segments $S_3$, $S_4$, and $S_5$; the $T_2$ and $S_{11}$ segment pair leads to 1 vote by target window segment $T_2$ for candidate source window 5 which contains source segments $S_9$, $S_{10}$, and $S_{11}$.

At the end of step 230, the method produces the voting results by the target window segments of the current target window and the associated candidate matching source windows as shown in TABLE 2.

TABLE 2

| Candidate Matching Source Windows | Source Window Segments | Number of Votes by Current Target Window |
| --- | --- | --- |
| 1 | $S_0, S_1, S_2$ | 3 |
| 2 | $S_1, S_2, S_3$, | 1 |
| 3 | $S_3, S_4, S_5$ | 2 |
| 4 | $S_7, S_8, S_9$ | 1 |
| 5 | $S_9, S_{10}, S_{11}$ | 1 |

Note that votes are weighted by the number of agreeing neighbors to increase accuracy, such as the case of candidate source window 1. The results of this example mean that candidate source window 1 has the highest potential match with the current target window T with 3 votes. The second highest potential match is candidate source window 3; the third highest potential match is a tie consisting candidate source windows 2, 4, and 5. These candidate matching source windows are the top 5 match of the candidate source windows.

Note also that large signatures often mean small values even if they represent fairly distinct data segments. Thus, a graduated scheme is used to set the threshold $\epsilon$ so that larger signatures get smaller thresholds. For example, in comparing two signatures $\sigma_1$ and $\sigma_2$, one embodiment of the present invention uses $\epsilon=0.05$ when $\min(\sigma_1, \sigma_2)>2^{24}$ and $\epsilon=0.08$ when $\min(\sigma_1, \sigma_2)<2^{16}$. Experimentation with a wide variety of data showed that these parameters provided the best balance between window selections and running time. However, these parameters can be arbitrarily chosen to suit a particular application or implementation.

In step 240, the top k candidate source window positions identified in step 230 that have the closest signature distance from a target window T will be applied as inputs to the detailed matching algorithm to a small neighborhood of the candidate source windows to find the best match to T. The detailed matching method is discussed in detail in FIGS. 5 and 6. In one embodiment of the present invention, the number of selected top candidates k=8 is used and 2λ (i.e., twice the length of a segment) for the search size for a candidate's neighborhood that will be used in the detailed matching method to be discussed later. Experimentation with a wide variety of data showed that these parameters provided the best balance between window selections and running time. However, these parameters can be arbitrarily chosen to suit a particular application or implementation.

The key step in matching windows is to measure their similarity. This is done by defining a distance between two data segments using their n-grams. Let $S_1$ and $S_2$ be two non-empty data segments with corresponding n-gram frequency arrays $F_{S_1}$ and $F_{S_2}$ computed by hashing n-grams as described in Equ. 1 and 2 and related exemplary programming loops described previously. The distance between $S_1$ and $S_2$ is defined as follows:

$$\Delta(S_1, S_2) = \frac{\sum_{i=0}^{A-1} |F_{S_1}[i] - F_{S_2}[i]|}{\sum_{i=0}^{A-1} \max(F_{S_1}[i], F_{S_2}[i])} \quad \text{(Equ. 5)}$$

The distance $\Delta$ is normalized so that $0 \leq \Delta(S_1, S_2) \leq 1$. This enables using some preset threshold to cut short a search for similar data segments. The parameters defining n-grams and frequency arrays can have large effect on the quality of $\Delta$. In one embodiment of the present invention, n=4 is used since that is the minimum match length allowed by the underlying delta compressor. The parameters $\alpha$ and A were set to be 101 and $2^{13}$. These choices keep the frequency arrays at a reasonable size with few n-gram collisions. Although $\Delta$ can be applied to data segments with different lengths, the use of $\Delta$ by the present invention to be shown below will always be on segments with the same length.

Considering an example of two data segments S and T with sizes s>t and a sub-segment of S with length t that matches T best needs to be found. The detailed matching algorithm in FIG. 5 shows how this can be done.

FIG. 5 illustrates a detailed window matching algorithm 500 in C programming codes of the present invention. The first loop computes the distance between T and an initial segment W of S of length t. The variables d and m keep the values of the sums used in defining the distance $\Delta$. Then, the second loop slides W over S one position at a time. At each step, W drops off the left-most n-gram and adds a new n-gram on the right. The frequency array $F_W$ and the variables d and m can be updated in constant time to reflect this. Therefore, the entire loop runs in time O(s). Omitted in the algorithm was the O(t) cost of computing the initial frequency arrays. Adding this back in, the algorithm, when given two data segments S and T with sizes s>t, can find a best match to a target window T in S in time O(s+t).

Figure 6:
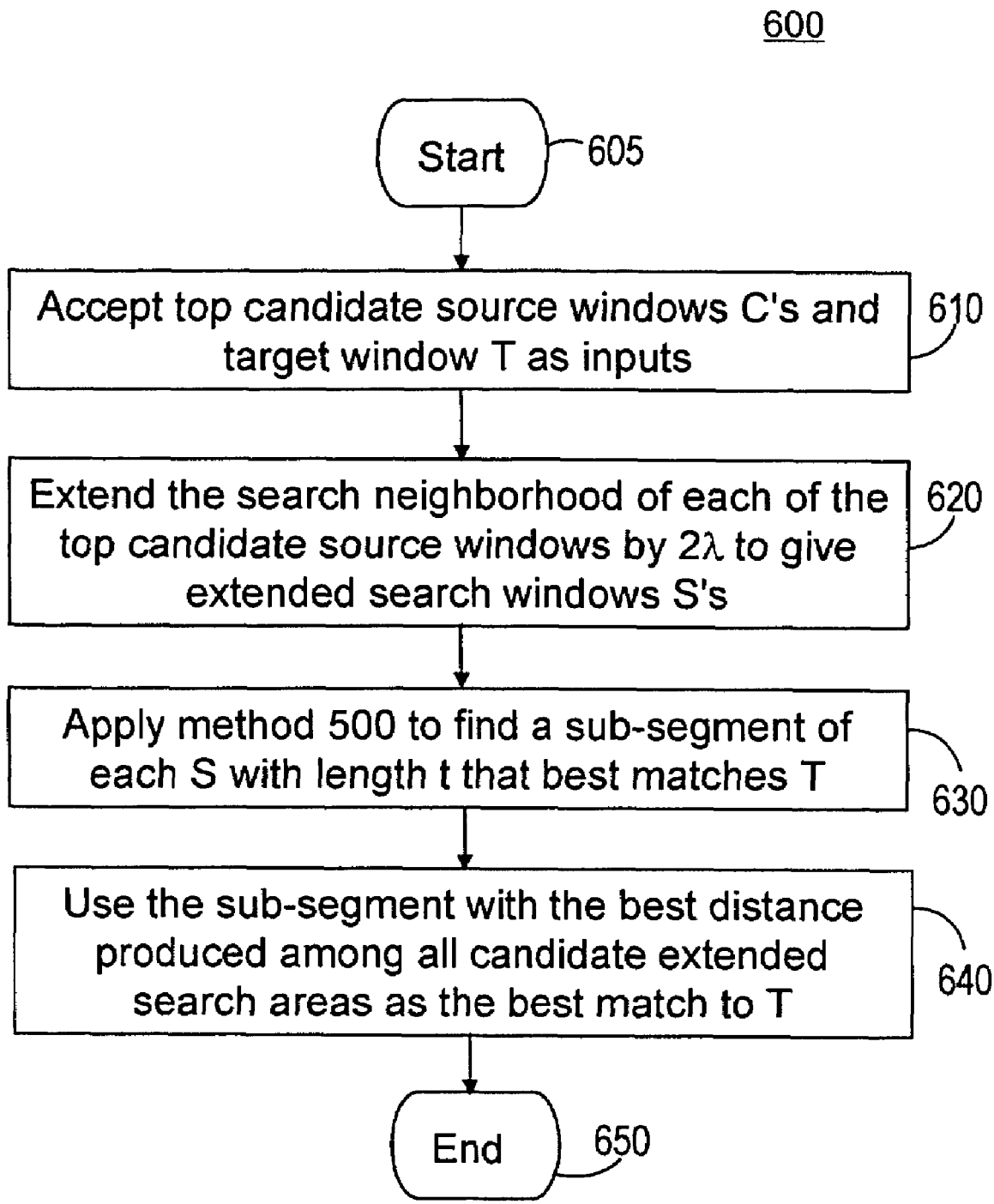
FIG. 6 illustrates a flowchart of a best match method for finding the best match between the target segment T among the top source window candidates.

FIG. 6 illustrates a flowchart of a best match method 600 using the top candidate source windows found by method 200 and the associated target window T as inputs to find the best match between the target segment T among the top source window candidates. Method 600 starts in step 605 and proceeds to step 610.

In step 610, the method accepts the top candidate source windows found by method 200 and the associated target window T as inputs.

Figure 7:
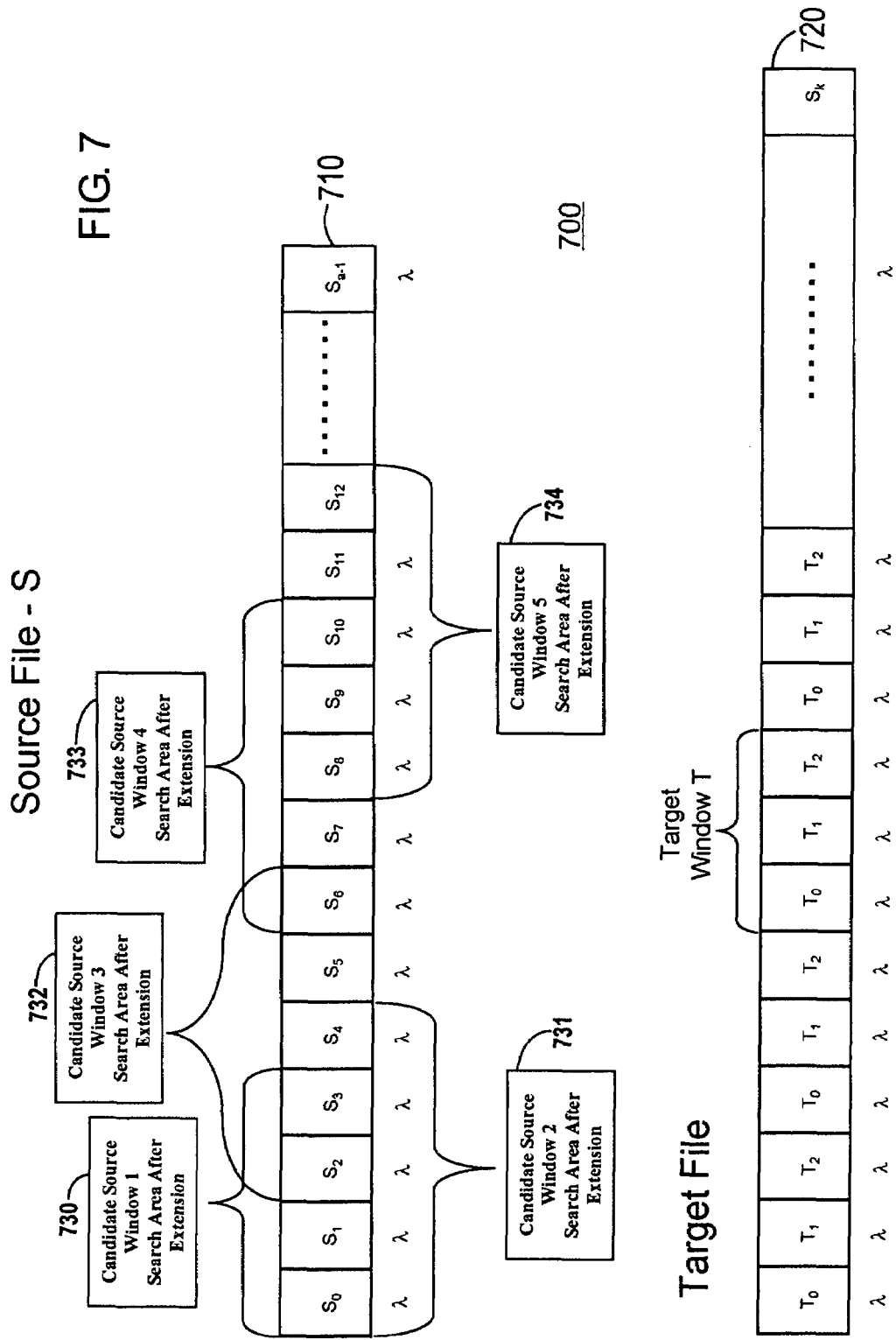
FIG. 7 illustrates an example of the extended search area for the top source window candidates and the associated target window T of the present invention.

In step 620, the method extends the search neighborhood of each of the top candidate source windows by 2λ to give extended search windows S's. For instance, for each of the top k source window candidate found in method 200, the method uses 2λ (i.e. twice the length of a segment) for the search size for a candidate's neighborhood. In other words, the method uses a candidate source window generated from method 200 and extend the search area λ to the right and λ to the left of the candidate source window. In the case the source window candidate is at the beginning of the source file, the extension of the search area to the left may not be possible and can be ignored. Similarly, in the case the source window candidate is at the end of the source file, the extension of the search area to the right may not be possible and can be ignored. FIG. 7 illustrates a continuation of the previous example used in describing method 200 to show the extended search area for the top 5 source window candidates and the associated target window T. 430 to 434 in FIG. 4 show the original top 5 source window candidates found by method 200. Now, by extending the search size by 2λ to each candidate window, the extended search area for these top 5 source window candidates 730 to 734 are shown in FIG. 7. For target window T, the search area for candidate source window 1 becomes $S_0$, $S_1$, $S_2$, and $S_3$. Note that the source window 1 search area cannot be extended to the left since it is already at the beginning of the file. Similarly, the search area for candidate source window 2 becomes $S_0$, $S_1$, $S_2$, $S_3$, and $S_4$; the search area for candidate source window 3 becomes $S_2$, $S_3$, $S_4$, $S_5$, and $S_6$; the search area for candidate source window 4 becomes $S_6$, $S_7$, $S_8$, $S_9$, and $S_{10}$; the search area for candidate source window 5 becomes $S_8$, $S_9$, $S_{10}$, $S_{11}$, and $S_{12}$.

In step 630, once the extended search area for each top source window candidate has been defined, method 500 can be used to find the best match between the extended search area for each of the top k candidates and the associated target window T. For candidate source window 1, the method uses method 500 to find a sub-segment with length t within the extended search area $S_0$, $S_1$, $S_2$, and $S_3$ that best matches the target window T. Similarly, for candidate source window 2, the method uses method 500 to find a sub-segment with length t within the extended search area $S_0$, $S_1$, $S_2$, $S_3$, and $S_4$ that best matches the target window T; for candidate source window 3, the method uses method 500 to find a sub-segment with length t within the extended search area $S_2$, $S_3$, $S_4$, $S_5$, and $S_6$ that best matches the target window T; for candidate source window 4, the method uses method 500 to find a sub-segment with length t within the extended search area $S_6$, $S_7$, $S_8$, $S_9$, and $S_{10}$ that best matches the target window T; for candidate source window 5, the method uses method 500 to find a sub-segment with length t within the extended search area $S_8$, $S_9$, $S_{10}$, $S_{11}$, and $S_{12}$ that best matches the target window T.

In step 640, the sub-segment with the best distance produced in step 630 among all candidate extended search areas will be used as the best match to T. The method terminates in step 650.

Figure 8:
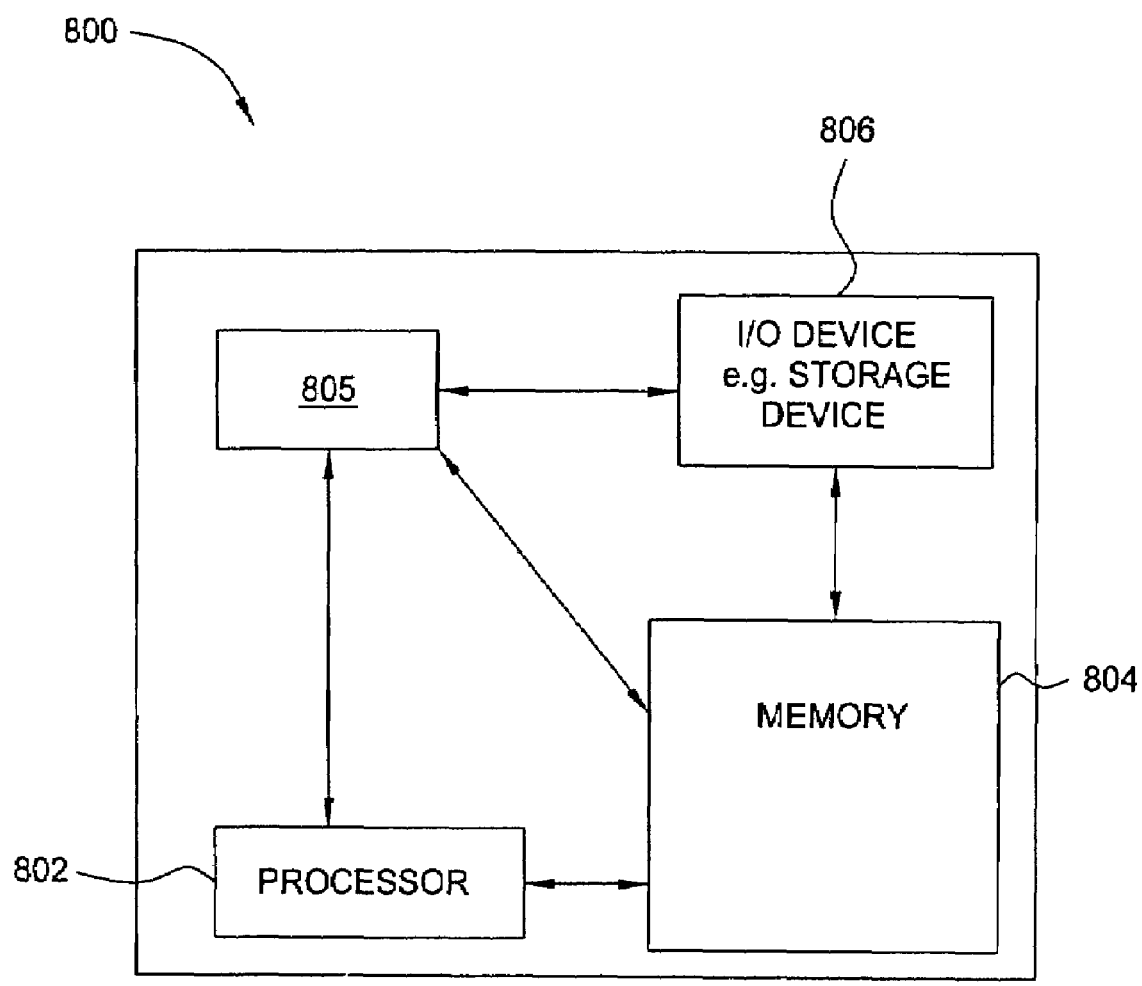
FIG. 8 illustrates the present window matching method implemented using a general purpose computer or any other hardware equivalents.

FIG. 8 illustrates the present window matching method(s) implemented using a general purpose computer 800 or any other hardware equivalents. For example, the present window matching methods and data structures can be represented by one or more software applications (or even a combination of software and hardware, e.g., using application specific integrated circuits (ASIC)), where the software is loaded from a storage medium 806, (e.g., a ROM, a magnetic or optical drive or diskette) and operated by the CPU 802 in the memory 804 of the system. As such, the present window matching methods and data structures of the present invention can be stored on a computer readable medium, e.g., RAM memory, ROM, magnetic or optical drive or diskette and the like.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for matching target file windows of a target file with source file windows of a source file used in a delta compression in delta compressors, said method comprising:
   partitioning the source file into a plurality of source file windows;
   partitioning the target file into a plurality of target file windows; and
   matching one of said plurality of source file windows with one of said target file windows based upon a distance function, wherein said distance function is as follows:

$$\Delta(S_1, S_2) = \frac{\sum_{i=0}^{A-1} |F_{S_1}[i] - F_{S_2}[i]|}{\sum_{i=0}^{A-1} \max(F_{S_1}[i], F_{S_2}[i])}$$

where,
$\Delta(S_1, S_2)$ is computed and stored as the distance function between two non-empty data segments, $S_1$ and $S_2$, as a measure of similarity between the two data segments, where A comprises a size of an n-gram frequency array, and
$F_{S_1}$ and $F_{S_2}$ are corresponding n-gram frequency arrays for data segments $S_1$ and $S_2$ respectively.

2. A method for matching target file windows of a target file with source file windows of a source file used in a delta compression in delta compressors, said method comprising:
   partitioning the source file into a plurality of source file windows;
   partitioning the target file into a plurality of target file windows;
   matching one of said plurality of source file windows with one of said target file windows based upon a distance function; and
   performing a fast search for matching source windows, wherein said fast search comprises a computation of a signature distance function based on a signature function σ:

$$\delta(P_1, P_2) = \frac{|\sigma(P_1) - \sigma(P_2)|}{\max(\sigma(P_1), \sigma(P_2))}$$

where $P_1$ and $P_2$ represent two data segments, wherein said signature function σ comprises a sum of hash values off all n-grams, wherein a result of said performing said fast search is stored.

3. A method for matching target file windows of a target file with source file windows of a source file used in a delta compression in delta compressors, said method comprising:
   partitioning the source file into a plurality of source file windows;
   partitioning the target file into a plurality of target file windows;
   matching one of said plurality of source file windows with one of said target file windows based upon a distance function as a measure of similarity between two data segments; and
   performing a fast search for matching source windows, wherein said fast search comprises:

a) partitioning a source file S into a sequence of segments each of a fixed size represented by $\lambda$;

b) partitioning a target window T into a sequence of segments each of a fixed size represented by $\lambda$;

c) computing and storing a set of all $S_i$'s such that $j<=i<=a-b$ and $\delta(S_i, T_j)<=\epsilon$ and asserting that $T_j$ votes for each such position $(i-j)\lambda$ as a candidate for a match for each segment $T_j$ in T, wherein said i denotes a location and said i is a non-negative integer location:, wherein said $S_i$ denotes a segment of said sequence of segments in said source file starting at said non-negative integer location i, wherein said $T_i$ denotes a segment of said sequence of segments in said target window starting at said location I, wherein said $\epsilon$ denotes a constant value, wherein a denotes a highest number of said sequence of segments in said source file, and wherein b denotes a highest number of said sequence of segments in said target window; wherein epsilon, $\epsilon$ is a predetermined non-null numerical value; and d) taking top k candidate positions and applying to a small neighborhood of them to find a best match to T.

4. The method of claim 3, wherein said parameter $\epsilon$ within said computing is a graduated threshold value.

5. A computer-readable storage medium having stored thereon a plurality of instructions, the plurality of instructions including instructions which, when executed by a processor, cause the processor to perform the steps of a method for matching target file windows of a target file with source file windows of a source file used in a delta compression in delta compressors, comprising of:

partitioning the source file into a plurality of source file windows;

partitioning the target file into a plurality of target file windows; and matching one of said plurality of source file windows with one of said target file windows based upon a distance function, wherein said distance function is as follows:

$$\Delta(S_1, S_2) = \frac{\sum_{i=0}^{A-1} |F_{S_1}[i] - F_{S_2}[i]|}{\sum_{i=0}^{A-1} \max(F_{S_1}[i], F_{S_2}[i])}$$

where, $\Delta(S_1, S_2)$ is computed and stored as the distance function between two non-empty data segments, $S_1$ and $S_2$, as a measure of similarity between the two data segments, where A comprises a size of an n-gram frequency array, wherein said i denotes a non-negative location and $F_{S_1}$ and $F_{S_2}$ are corresponding n-gram frequency arrays for data segments $S_1$ and $S_2$ respectively.

6. A computer-readable storage medium having stored thereon a plurality of instructions, the plurality of instructions including instructions which, when executed by a processor, cause the processor to perform the steps of a method for matching target file windows of a target file with source file windows of a source file used in a delta compression in delta compressors, comprising of:

partitioning the source file into a plurality of source file windows;

partitioning the target file into a plurality of target file windows;

matching one of said plurality of source file windows with one of said target file windows based upon a distance function as a measure of similarity between two data segments; and performing a fast search for matching source windows, wherein said fast search comprises a computation of a signature distance function based on a signature function $\sigma$:

$$\delta(P_1, P_2) = \frac{|\sigma(P_1) - \sigma(P_2)|}{\max(\sigma(P_1), \sigma(P_2))}$$

where $P_1$ and $P_2$ represent two data segments, wherein said signature function $\sigma$ comprises a sum of hash values off all n-grams, wherein a result of said performing said fast search is stored.

7. A computer-readable storage medium having stored thereon a plurality of instructions, the plurality of instructions including instructions which, when executed by a processor, cause the processor to perform the steps of a method for matching target file windows of a target file with source file windows of a source file used in a delta compression in delta compressors, comprising of:

partitioning the source file into a plurality of source file windows;

partitioning the target file into a plurality of target file windows;

matching one of said plurality of source file windows with one of said target file windows based upon a distance function; and performing a fast search for matching source windows, wherein said fast search comprises:

a) partitioning a source file S into a sequence of segments each of a fixed size represented by $\lambda$;

b) partitioning a target window T into a sequence of segments each of a fixed size represented by $\lambda$;

c) computing and storing a set of all $S_i$'s such that $j<=i<=a-b$ and $\delta(S_i, T_j)<=\epsilon$ and asserting that $T_j$ votes for each such position $(i-j)\lambda$ as a candidate for a match for each segment $T_j$ in T, wherein said j denotes a location and said i is a non-negative integer location, wherein said $S_i$ denotes a segment of said sequence of segments in said source file starting at said non-negative integer location i, wherein said $T_i$ denotes a segment of said sequence of segments in said target window starting at said location I, wherein said $\epsilon$ denotes a predetermined non-null numerical value, wherein a denotes a highest number of said sequence of segments in said source file, and wherein b denotes a highest number of said sequence of segments in said target window; and d) taking top k candidate positions and applying to a small neighborhood of them to find a best match to T.

8. The computer-readable medium of claim 7, wherein said parameter $\epsilon$ within said computing is a graduated threshold value.

9. An apparatus for matching target file windows of a target file with source file windows of a source file used in a delta compression in delta compressors, comprising:

means for partitioning the source file into a plurality of source file windows;

means for partitioning the target file into a plurality of target file windows; and means for matching one of said plurality of source file windows with one of said target file windows based upon a distance function, wherein said distance function is as follows:

$$\Delta(S_1, S_2) = \frac{\sum_{i=0}^{A-1} |F_{S_1}[i] - F_{S_2}[i]|}{\sum_{i=0}^{A-1} \max(F_{S_1}[i], F_{S_2}[i])}$$

where, $\Delta(S_1, S_2)$ is computed and stored as the distance function between two non-empty data segments, $S_1$ and $S_2$, as a measure of similarity between the two data segments, where A comprises a size of an n-gram frequency array, wherein said i is a non-negative integer location; and $F_{S_1}$ and $F_{S_2}$ are corresponding n-gram frequency arrays for data segments $S_1$ and $S_2$ respectively.

* * * * *